United States Patent [19]
Sue et al.

[11] Patent Number: 4,812,674
[45] Date of Patent: Mar. 14, 1989

[54] SAFETY GATE LIMIT SWITCH USING HALL EFFECT TRANSDUCER

[75] Inventors: Horace O. Sue, Asheville, N.C.; Richard T. Guttman, Palatine, Ill.; David M. Pendley, Fletcher; William C. Keys, Asheville, both of N.C.

[73] Assignee: Square D Company, Palatine, Ill.

[21] Appl. No.: 23,885

[22] Filed: Mar. 12, 1987

Related U.S. Application Data

[63] Continuation of Ser. No. 736,487, May 20, 1985, abandoned.

[51] Int. Cl.<sup>4</sup> ............................................. H01L 29/82
[52] U.S. Cl. ................................. 307/116; 307/113; 361/179; 361/180; 361/181; 340/679; 340/552
[58] Field of Search ................ 307/116, 113, 149; 340/541, 547, 551, 552, 553, 554, 561, 567, 572, 573, 679; 192/129 R, 129 A, 130, 127, 133; 74/566, 508, 512, 515; 361/181, 179, 180, 182, 183, 191

[56] References Cited

U.S. PATENT DOCUMENTS

| 3,409,842 | 11/1968 | Embling et al. | 361/181 X |
|---|---|---|---|
| 3,419,798 | 12/1968 | Walton | 324/45 |
| 3,454,869 | 7/1969 | Strauss et al. | 361/179 X |
| 3,473,109 | 9/1967 | Maaz et al. | 324/34 |
| 3,558,934 | 1/1971 | Weissenbrunn et al. | 307/309 |
| 3,601,620 | 8/1971 | Gee | 361/180 X |
| 3,657,686 | 4/1972 | Masuda et al. | 338/32 H |
| 3,875,423 | 4/1975 | Kemper | 307/113 |
| 3,886,413 | 5/1975 | Dow et al. | 361/181 |
| 4,021,728 | 5/1977 | Makino et al. | 361/180 |
| 4,063,230 | 12/1977 | Purinton et al. | 340/552 X |
| 4,075,961 | 2/1978 | Harris | 361/179 X |
| 4,119,864 | 10/1978 | Petrizio | 361/181 X |
| 4,271,763 | 6/1981 | Berger | 361/180 X |
| 4,280,164 | 7/1981 | Kozek | 361/179 |
| 4,335,376 | 6/1982 | Marquardt | 340/547 |
| 4,349,814 | 9/1982 | Akehurst | 340/679 |
| 4,553,040 | 11/1985 | Truper et al. | 307/116 |

Primary Examiner—William M. Shoop, Jr.
Assistant Examiner—Paul Ip
Attorney, Agent, or Firm—Richard T. Guttman; A. Sidney Johnston

[57] ABSTRACT

A proximity switch has at least three Hall effect magnetic field sensitive transducers mounted in a transducer housing and has at least two magnets mounted in a magnet housing. The transucers produce logic signals, and a logic circuit responsive to these logic signals activates an electrical switch only when the magnets are in a proper position relative to the transducers. The electrical switch may be used to control a machine, and the machine is not activated until the proximity switch is activated.

21 Claims, 5 Drawing Sheets

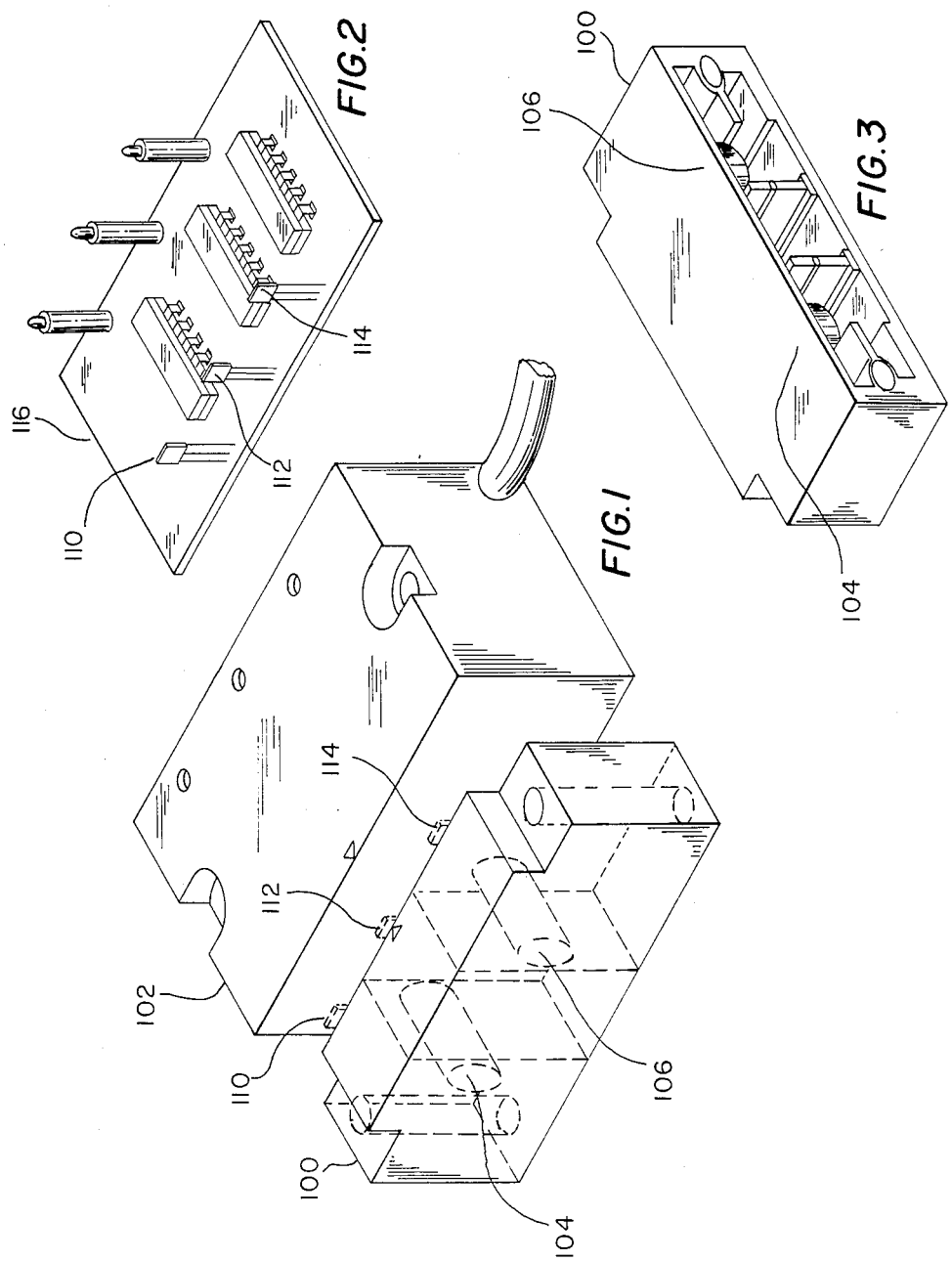

4,812,674

SAFETY GATE LIMIT SWITCH USING HALL EFFECT TRANSDUCER

This application is a continuation of application Ser. No. 736,487, filed on 5-20-85 now abandoned.

FIELD OF THE INVENTION

The invention relates to safety gate limit switches used as safety devices for moving machinery, and more particularly to the use of magnets and Hall effect transducers in safety gate limit switches.

BACKGROUND OF THE INVENTION

In the control of machine tools, it is important for operator safety to activate the machine tool only when a safety gate is in place to protect the operator from physical harm. The operator may be injured by the machine tool moving and inadvertently striking the operator. A limit switch is often used to prevent the machine tool from moving before the safety gate is in place. A number of limit switches have been devised in the past for the control of a machine tool. Many attempts in the past have been made to adapt a mechanically operated toggle switch to sense the presence of a closed safety gate. A disadvantage of a mechanically operated toggle switch is that is can be defeated by operator action. For example, a toggle switch may be taped closed, or may be wired closed. The machine tool can then be operated with the safety gate in an unsafe position.

A problem addressed by the present invention is to make a safety gate limit switch which is difficult to defeat by action of the operator. Akehurst, U.S. Pat. No. 4,349,814, issued on Sept. 14, 1982, shows the use of Hall effect magnetic field sensors to make a safety gate limit switch. Akehurst uses Hall effect transducers arranged to require magnetic poles of opposite polarity to activate his limit switch. A disadvantage with this arrangement is that a short bar magnet having a north pole and a south pole at opposite ends could be placed in proximity to the magnetic field detector and thereby expose the two Hall effect transducers to the proper magnetic fields for activating the switch. A further problem addressed by the present invention is to provide a magnetic field sensing arrangement which provides greater safety against being overridden by any simple action of the operator, and also to provide a detector system and logic circuit for the invention.

SUMMARY OF THE INVENTION

The invention solves the problem of making a proximity switch which is difficult for an operator to defeat by using at least two magnets and three Hall effect magnetic field sensing transducers. The invention is a proximity switch comprising at least three magnetic field sensitive transducers mounted in a transducer housing and having a first conductive state in the presence of a magnetic field of predetermined magnitude and predetermined direction and a second conductive state in the absence of a magnetic field having the predetermined magnitude and direction. At least two magnets are mounted in a magnet housing and each is capable of putting the transducers into the first conductive state when placed near the transducers, and are positioned in the magnet housing so that when the magnet housing is located at a predetermined position relative to the transducer housing at least two of the transducers are in a magnetic field capable of putting the transducers into the first conductive state and at least one of the transducers is in a magnetic field not capable of putting the transducers into the first conductive state. A logic circuit responds to the conductive states of the at least three transducers and is capable of generating an output signal having a first value when the at least two of the transducers are in the first conductive state and at least one of the transducers in the second conductive state and has a second value when the transducers have any other combination of conductive states, and an electronic switch responds to the output signal of the logic circuit and is capable of closing when the output signal has the first value and is capable of opening when the output signal has the second value so that the electronic switch is closed when the magnet housing is in the first predetermined position relative to the transducer housing, and is open for other relative positions of the magnet housing and the transducer housing.

Other and further aspects of the present invention will become apparent during the course of the following description and by reference to the accompanying drawings.

BRIEF DESCRIPTION OF THE DRAWINGS

Referring now to the drawings, in which like numerals represent like parts in the several views:

FIG. 1 is a perspective view of a safety gate limit switch.

FIG. 2 is a perspective view of an electronic circuit board.

FIG. 3 is a bottom perspective view of a magnet housing.

DETAILED DESCRIPTION

Figure 4:
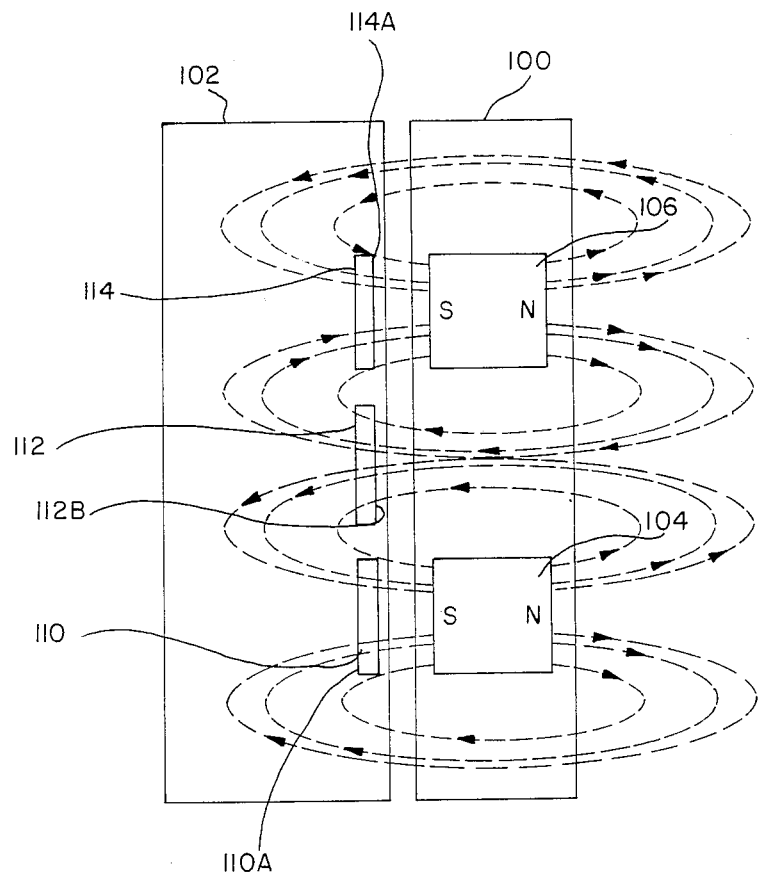
FIG. 4 is a top view showing magnets and magnetic field lines.

FIG. 1 shows a safety gate limit switch having a magnet housing 100 and a transducer housing 102. Magnets 104 and 106 are contained within magnet housing 100. Hall effect magnetic field detectors 110, 112 and 114 are located within transducer housing 102. Magnet housing 100 is named the "key". The transducer housing 102 containing the Hall effect magnetic field sensors is named the "switch".

Hall effect magnetic field sensors 110, 112, 114 are capable of producing an electric logic signal indicative of the presence of a magnetic field above a threshold value. For example, it has been found satisfactory in the present invention to use Sprague Electric Company, Semiconductor Division, located at Pembrook Road, Concord, New Hampshire, product model No. UGN-3040U Solid State Hall Effect Digital Switches for magnetic field detectors 110, 112, 114. For example, the Sprague product model No. UGN-3040U has a logical "1" output in a magnetic field less than about 200 gauss, and has a logical "0" output for a magnetic field exceeding about 200 gauss, so long as the magnetic field is directed toward a predetermined side of the product.

FIG. 2 is a perspective view of an electronic circuit board 116 showing magnetic field detectors 110, 112, 114 mounted thereupon. Also, mounted upon electronic circuit board 116 are integrated circuits, resistors, capacitors, transistors, and indicating lights. Light emitting diodes (LED's) may be used for indicating lights.

FIG. 3 is a perspective drawing showing magnetic housing 100 turned so that the magnets mounted therein are visible. FIG. 4 is a top view showing magnets 104 and 106 mounted in magnet housing 100, and magnetic field detectors 110, 112, 114 mounted in transducer housing 102. Both magnets 104 and 106 are shown with their south pole oriented toward their respective magnetic field detectors 110, 114. Magnetic field lines are drawn leaving magnets 104, 106 from the north pole and circling around lines of constant field strength to the south pole. Thus, the magnetic field penetrates magnetic field detectors 110 and 114 from sides 110A and 114A respectively. In contrast, weaker magnetic fields penetrate magnetic field detector 112 from side 112B. The magnetic field detectors are capable of responding to the direction of a magnetic field applied to them. Magnetic field detectors 110, 112, 114 are oriented similarly in transducer housing 102 so that they produce an output logic signal indicating the presence of a magnetic field when the magnetic field both penetrates the detectors from side 110A, 114A as it does in FIG. 4 for detectors 110 and 114 and has a magnitude exceeding a threshold value, for example, exceeding 100 gauss. The detectors produce a logic signal indicating the absence of an appropriate magnetic field when the field penetrates a detector such as is shown in FIG. 4 for detector 112 by entering the detector through side 112B.

A logic circuit which measures the output of magnetic field detectors 110, 112, 114 detects the output of the magnetic field detectors and produces a final output logic signal which has a first value if the magnets in the magnet housing have their south poles adjacent to detectors 110 and 114. The logic circuit produces an output indicative of the absence of appropriate magnetic fields if no magnetic field penetrates detectors 110 and 114 from sides 110A, 114A as shown in FIG. 4, or if a magnetic field penetrates magnetic field detector 112 from side 112A. Thus, the magnet housing 100 must be properly positioned with respect to transducer housing 102 in order for the logic signal to produce the output indicating the presence of appropriate magnetic fields at the locations of magnetic field detectors 110, 112, and 114.

The apparatus of the invention is used as a safety gate limit switch by having magnet housing 100 mounted on, for example, a safety gate surrounding moving parts of a machine tool. Transducer housing 102 may be mounted, for example, on a stationary part of the machine tool. When the safety gate is closed, for example, thereby preventing an operator from having his hands in a position where the machine tool could harm his hands, the south poles of the magnets will be aligned as shown in FIG. 4 with magnetic field detectors 110, 112, 114. The output of the logic circuit will then indicate that the safety gate is closed, and enable operation of the machine tool.

Figure 5:
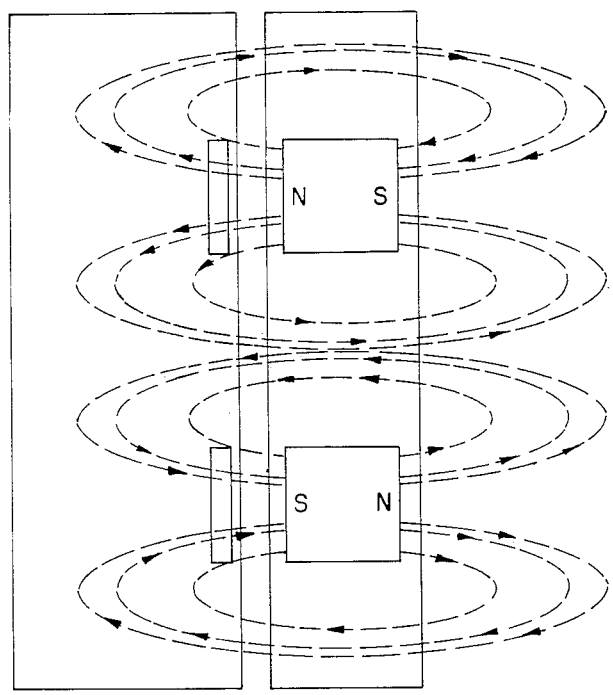
FIG. 5 shows prior art.

An arrangement of magnets and magnetic field detectors shown by Akehurst, U.S. Pat. No. 4,349,814 issued Sept. 14, 1982, is shown in FIG. 5.

Figure 6:
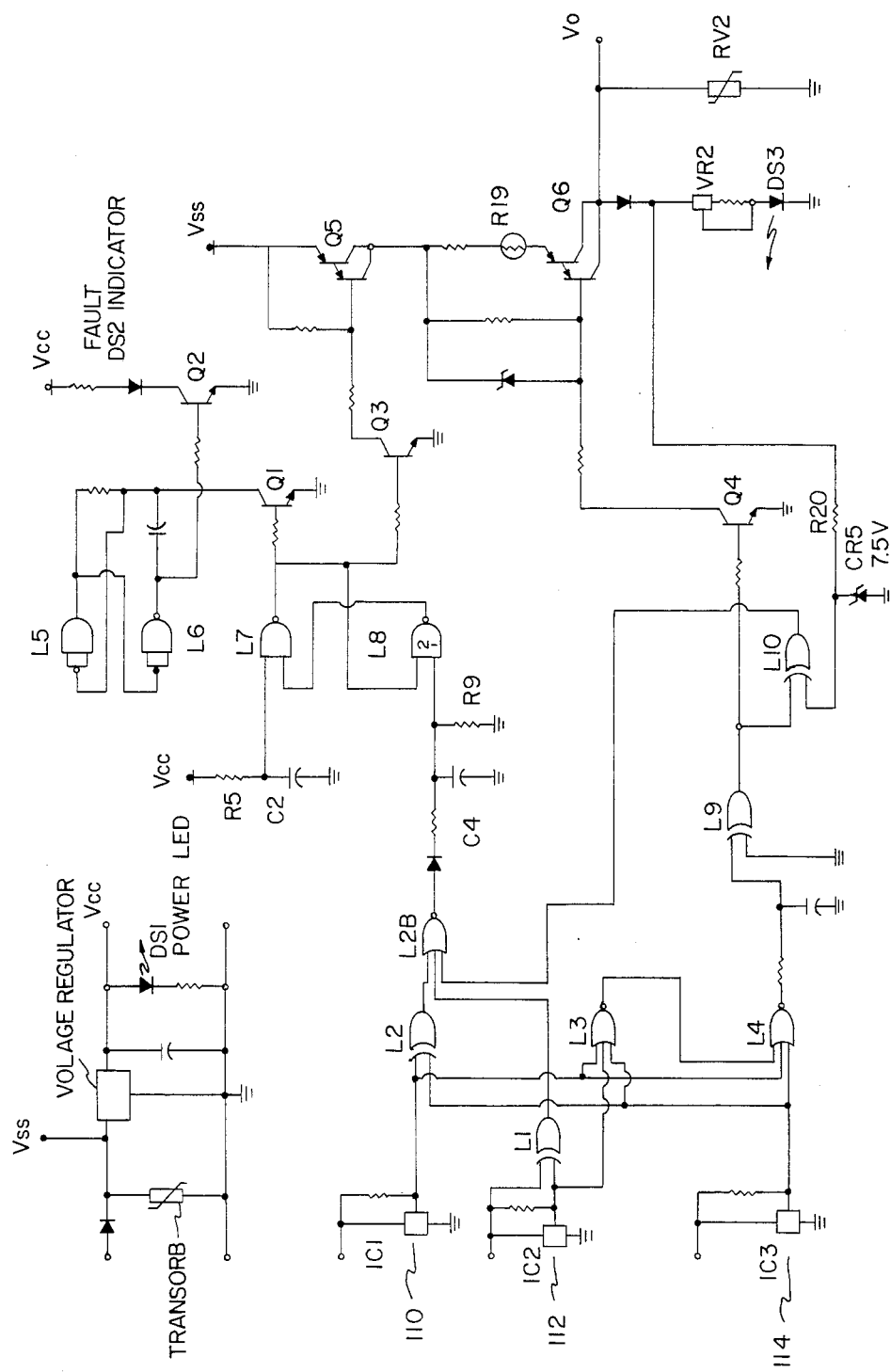
FIG. 6 is a schematic diagram of a detector and logic circuit.

FIG. 6 shows a schematic diagram of the detector logic circuit. Magnetic field detectors 110, 112, and 114 are shown connected to logic circuits. Logic circuits are designated by the reference numerals L1, L2, L2B, L3, L4, L5, L6, L7, L8, L9, and L10. Transistors are designated by the reference numerals Q1, Q2, Q3, Q4, Q5, and Q6.

The output voltage of the logic circuit is indicated by the reference numeral $V_0$. Magnetic field detector 110 is represented by integrated circuit IC1, magnetic field detector 112 is represented by IC2, and magnetic field detector 114 is represented by IC3. When magnetic south poles are adjacent to magnetic field detectors 110 and 114, and no magnetic field is applied to magnetic field detector 112, then IC1 output has a logical level 0, IC2 oputput has a logical level 1, and IC3 output has a logical level 0. Logic circuit L1 thus has two inputs of logic level 1, and therefore generates an output of logic level 0 which is applied to logic circuit L2B. IC1 output has a logical level 0 resulting from the presence of a south magnetic pole, and this output is applied to logic circuits L2, L3, and L4. IC3 output has a logical level 0 as a result of the presence of a south magnetic pole, and this output is fed to logic circuits L2, L3, and L4. L2 then has an output 0, L3 has an output 0, and L4 has an output 1. Logic circuit L2B has an output 1. The output of logic circuit L2B goes through a diode to capacitor C4 and resistor R9. The time constant of capacitor C4 and resistor R9 is approximately 1.8 seconds. When the logic level output from logic circuit L2B changes, it takes approximately 1.8 seconds for the input at pin 1 of logic circuit L8 to correspondingly change as a result of the time constant of capacitor C4 and resistor R9. The 1.8 seconds time constant permits the magnet housing to slide across the transducer housing without triggering a fault condition if the housing slides quickly relative to 1.8 seconds. Logic circuit L7 has an output 1, and logic circuit L8 has an output 0. Thus, a logic signal 1 is applied to Q3 turning it on and turning on transistor Q5. Fault indicator lamp DS2 is turned off. Logic circuit L9 has a logical 1 input from logic circuit L4 and a logical 0 input from its grounded input. Logic circuit L9 therefore has a logical 1 output which turns transistor Q4 on, which in turn turns transistor Q6 on. Transistors Q5 and Q6 are therefore both on, and an electric current flows from the power supply VSS to ground through transistors Q5 and Q6 and through current regulator VR2. Thus, voltage $V_0$ has a logic 1 value. The logic 1 value of voltage $V_0$ activates a control unit (shown in FIG. 7) in order to activate a machine as a result of south magnetic poles being presented simultaneously to magnetic field detector integrated circuits IC1 and IC3 in the absence of a south magnetic pole being applied to integrated circuit IC2. Also, when voltage $V_0$ has a logic 1 value, the load indicator LED DS3 is illuminated. Zener diode CR5 clamps the corresponding input to L10 to 7.5 volts when $V_0$ is at logic value 1. Voltage $V_0$ goes to nearly the power supply voltage VSS, which may be between 10 to 30 volts, when at logic value 1. Transorb RV2 attenuates transients on the output voltage $V_0$.

Logic circuits L7 and L8 establish proper levels at the time that power is applied to the circuit. After power is applied to the circuit, the state of the NAND flip-flop comprising L7 and L8 is such that the output of L7 is a logic 1 and the output of L8 is a logic 0. This is effected by the time constant R5 C2 being 10 times the value of the time constant of R8 C4.

The flip-flop comprising L7 and L8 changes states if the output of L2B should change to and remain at a logic 0 for approximately 1.8 seconds. This will occur if the magnetic field detectors 110, 112 and 114 sense for approximately 1.8 sconds a magnetic field pattern other than that produced by the correct key, (as shown in FIG. 4) or if the output Vo of the device is shorted to ground for about 1.8 seconds when the device is in the "on" state.

Both L5 and L6 form an oscillator that activates the flashing fault LED DS2 by way of transistor Q2. The oscillator L5 and L6 is activated in response to the output of L7 having a logic value 0.

The logic level Vo at the output is monitored by logic circuit L10. If Q6 were to fail by short circuiting when the safety gate limit switch is in the off state (that is Vo has logic level 0), then this condition will be detected by L10 and Q5 will be turned off in response to logic circuit L2B after about 1.8 seconds.

Thermistor R19 increases in resistance in response to an overload current or in response to high temperature. Thermistor R19 is in thermal contact with transistor Q6. If transistor Q6 should overheat, then thermistor R19 will limit the load current thereby protecting Q5 and Q6.

In the event that south magnetic poles are applied to integrated circuit IC2 as well as integrated circuits IC1 and IC3, then integrated circuit IC2 has a logic 0 output. This output is fed to logic circuit L1 which then has an output of logic 1. This logic 1 output is connected to logic circuit L2B, thereby producing an output logical 0 from L2B. The logical 0 output from L2B causes a logical 1 output from logic circuit L8 and a logical 0 output from logic circuit L7. The logical 0 output from logic circuit L7 turns off transistor Q3 which in turn turns off transistor Q5. Also, logic circuit L4 has a logical 0 output which causes logic circuit L9 to have a logical 0 output. The output of logic circuit L9 turns off transistor Q4 which in turn turns off transistor Q6. With transistors Q5 and Q6 turned off, no current flow occurs from the power supply VSS through current regulator VR2, thereby driving output voltage $V_0$ to ground, which is a logic value of 0. The logical 0 value for output voltage $V_0$ then deactivates a control unit (shown in FIG. 7) for the machine controlled by the invention. Other combinations of south magnetic poles or no presentation of south magnetic poles to integrated circuits IC1, IC2, and IC3 are shown in Table 1. In all cases, the output voltage $V_0$ has a value of logic 0.

In Table 1 the columns M1, M2, M3 refer to the placement of a magnetic pole adjacent to IC1, IC2, IC3, respectively. The column L1-L10 give the logical output of the respective logic circuits with the arrangement of magnetic poles shown in columns M1, M2 and M3. The column "FAULT LED" shows whether LED diode DS2 is on or off. The columns Q5, Q6 show whether transistor Q5 and Q6 are turned on or off. The column $V_0$ shows the logical level of the output voltage $V_0$. Under columns L5 and L6 the word "OSC" means that L5 and L6 are oscillating.

Figure 7:
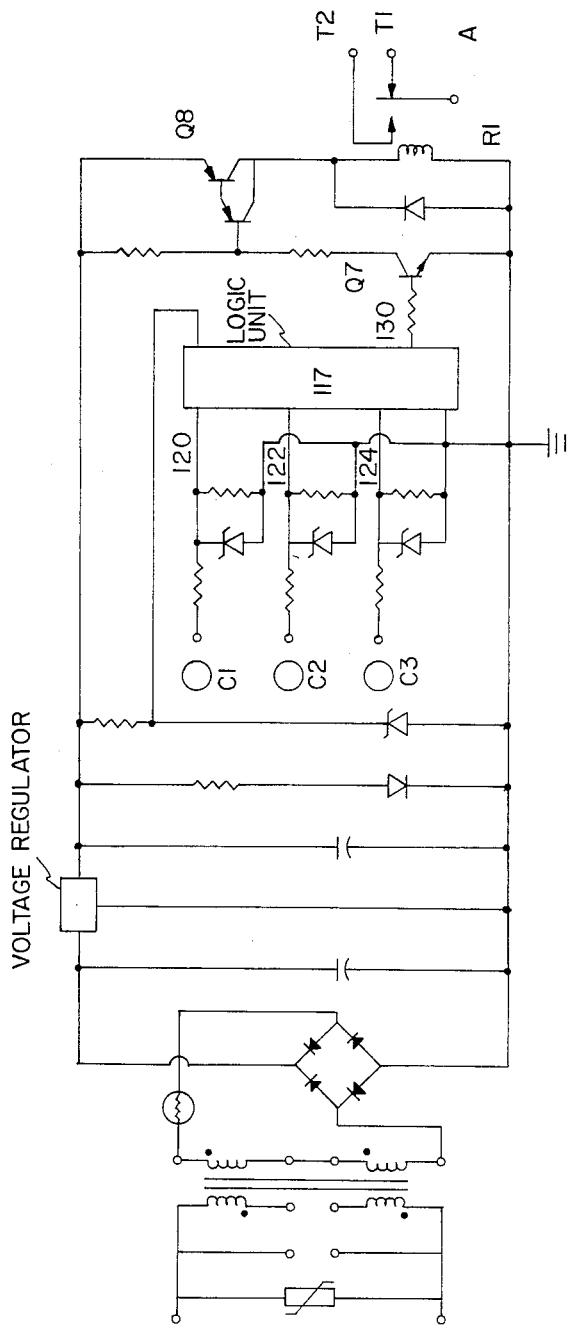
FIG. 7 is a schematic diagram of a power supply and additional logic circuit for use with a plurality of safety gate limit switches.

FIG. 7 shows a power supply for a plurality of safety gate limit switches and a final logic circuit L11. Output voltage $V_0$ from a single safety gate limit switch is attached to any of contacts C1, C2 or C3. Logic circuit L11 can be adjusted to produce an output if any of the selected inputs has a logic value 1. Alternatively, logic circuit L11 can have safety gate limit switches connected to each of its inputs or to a lesser number of its inputs. Logic circuit L11 can be adjusted to produce an output signal only if all of its inputs connected to safety gate limit switches have their respective input voltages $V_0$ set to logic value 1. Logic circuit L11 output turns transistor Q7 on, and transistor Q7 in turn turns transistor Q8 on. Current flow through transistor Q8 energizes relay R1, thereby causing armature A to move from position closing terminal T1 to the position closing terminal T2. Thus, when relay R1 is energized a complete circuit is produced between armature A and terminal T2. When relay R1 is not energized an electric circuit exists between armature A and terminal T1. Relay R1 can be used to control a machine, for example a machine tool. A circuit exists from armature A to terminal T2 only when the safety gate protecting the machine is in a protective position.

The circuit as set forth in FIG. 6 has two substantially independent interconnected logic paths. The first logic path actuates transistor Q6 in response to logical states of the Hall effect transducers 110, 112 and 114. The first logical path uses logical circuits L3, L4 and L9, and these logical circuits drive transistors Q5 and Q6.

The second logical path provides self-checking of fault conditions and turns transistor Q5 off if a fault condition is indicated. The second logical path uses logical circuits L1, L2, L2B, L7 and L8, and these logical circuits drive transistors Q3 and Q5. Also, they drive the oscillator made up of logical circuits L5 and L6 to provide a flashing signal to fault diode LED DS2. Logical circuits L7 and L8 are a flip-flop which has two functions, the first as noted above is to establish proper logical levels at the time that power is applied to the circuit. The second purpose of flip-flop L7 and L8 is to lock transistors Q5 in an "off" state in the event that a fault condition is sensed by the second logical path. The fault conditions that the second logical path responds to include failure of any of the Hall effect transducers to operate in response to the key, an attempt by a person to over-ride the transducers by application of inappropriate magnetic fields, a stray magnetic field operating on all tansducers with the same polarity, a short of V0 to ground when the first logical circuit requires V0 to be at logical level 1, and the converse where output voltage V0 is in logical state 1 when the output of the first logical circuit requires that Q6 be turned "off".

Figure 8:
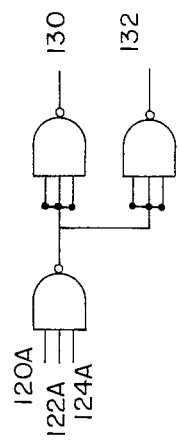
FIG. 8 is a schematic diagram of a logic circuit.

FIG. 8 shows the logical connection within logical circuit L11. Inputs 120, 122 and 124 (shown in FIG. 7)

TABLE 1

| | | | Logic Circuit Level Counter Conditions | | | | | | | | | | | | | |
|---|---|---|---|---|---|---|---|---|---|---|---|---|---|---|---|---|
| M1 | M2 | M3 | L1 | L2 | L3 | L4 | L5 | L6 | FAULT LED | L7 | L8 | L9 | L10 | Q5 | Q6 | $V_O$ |
| None | None | None | 0 | 0 | 0 | 0 | 1 | 0 | Off | 1 | 0 | 0 | 0 | On | Off | 0 |
| South | None | South | 0 | 0 | 0 | 1 | 1 | 0 | Off | 1 | 0 | 1 | 0 | On | On | 1 |
| South | South | South | 1 | 0 | 1 | 0 | OSC | OSC | On | 0 | 1 | 0 | 0 | Off | Off | 0 |
| South | South | None | 1 | 1 | 0 | 0 | OSC | OSC | On | 0 | 1 | 0 | 0 | Off | Off | 0 |
| South | None | None | 0 | 1 | 0 | 0 | OSC | OSC | On | 0 | 1 | 0 | 0 | Off | Off | 0 |
| None | South | None | 1 | 0 | 0 | 0 | OSC | OSC | On | 0 | 1 | 0 | 0 | Off | Off | 0 |
| None | None | South | 0 | 1 | 0 | 0 | OSC | OSC | On | 0 | 1 | 0 | 0 | Off | Off | 0 |
| None | South | South | 1 | 1 | 0 | 0 | OSC | OSC | On | 0 | 1 | 0 | 0 | Off | Off | 0 | connect to inputs 120A, 122A, 124A. Output 130 drives transistor 7. Logical unit 132 is not used.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A proximity switch comprising:
   at least three magnetic field sensitive transducers mounted in a transducer housing, said at least three magnetic field sensitive transducers having a first conductive state in the presence of a magnetic field of predetermined magnitude and predetermined direction, and a second conductive state in the absence of a magnetic field having said predetermined magnitude and direction;
   at least two magnets mounted in a magnet housing and each said at least two magnets capable of putting each said transducer into said first conductive state when one of said at least two magnets is placed near said transducer, and said at least two magnets positioned in said magnet housing so that when said magnet housing is located at a predetermined position relative to said transducer housing at least two of said transducers are in a magnetic field produced by said at least two magnets, said magnetic field capable of putting said transducers into said first conductive state and at least one of said transducers is in a magnetic field not capable of putting said transducers into said first conductive state;
   a logic circuit responsive to the conductive states of said at least three transducers and capable of generating an output signal having a first value when said at least two of said transducers are in said first conductive state and at least one of said transducers is in said conductive state, and having a second value when said transducers have any other combination of conductive states; and,
   an electronic switch, responsive to said output signal of said logic circuit said electronic switch capable of closing when said output signal has said first value and capable of opening when said output signal has said second value, so that said electronic switch is closed when said magnet housing is in said predetermined position relative to said transducer housing and is open for other relative positions of said magnet housing and said transducer housing.

2. A proximity switch as in claim 1 further comprising means for indicating a fault, said means for indicating a fault being activated if three of said transducers are in said first conductive state.

3. The apparatus as in claim 1 wherein said transducers are caused to go into said first conductive state by the presence of a south pole of a magnet near said transducer.

4. The apparatus as in claim 1 wherein said at least three magnetic field sensitive transducers are arranged in a substantially horizontal row so that said at least two transducers, which must be in said first conductive state in order to close said electronic switch, are mounted so that a third of the said at least three magnetic field sensitive transducer is between said first two transducers.

5. The apparatus as in claim 1 wherein said magnetic field of predetermined magnitude comprises a magnetic field of at least 100 gauss.

6. The apparatus as in claim 1 wherein said magnetic field of predetermined magnitude and predetermined direction is produced by the south poles of a plurality of magnets placed in proximity to predetermined locations on said transducer housing.

7. The apparatus as in claim 1 wherein said logic circuit produces an output signal indicating a fault when said at least two magnets put other than their respective said at least two transducers in said first conductive state.

8. The apparatus as in claim 7 wherein said logic circuit has a time delay before a fault condition is enabled.

9. The apparatus as in claim 8 wherein said time delay is between 1.0 seconds and 2.0 seconds.

10. A system of proximity switches comprising:
    a plurality of proximity switches each having at least three magnetic field sensitive transducers mounted in a respective transducer housing and having a first conductive state in the presence of a magnetic field of predetermined magnitude and predetermined direction, and a second conductive state in the absence of a magnetic field having said predetermined magnitude and direction;
    at least two magnets mounted in a magnetic housing and each capable of putting said transducers into said first conductive state when placed near said transducers, and positioned in said magnetic housing so that when said magnet housing is located at a predetermined position relative to said transducer housing at least two of said transducers are in a magnetic field capable of putting said transducers into said first conductive state and at least one of said transducers is in a magnetic field not capable of putting said transducers into said first conductive state;
    a first logic circuit responsive to the conductive states of said at least three transducers and capable of generating an output signal having a first value when said at least two of said transducers are in said first conductive state and at least one of said transducers is in said second conductive state, and having a second value when said transducers have any other combination of conductive states;
    an electronic switch responsive to said output signal of said logic circuit and capable of closing when said output signal has said first value and capable of opening when said output signal has said second value, so that said electronic switch is closed when said magnet housing is in said predetermined position relative to said transducer housing and is open for other relative positions of said magnet housing and said transducer housing; and
    a second logic circuit responsive to said electronic switches of said plurality of proximity switches for closing a second switch when said plurality of proximity switches have their respective said electronic switches closed, and said second switch is open if less than all of said electronic switches of said proximity switches are not all closed.

11. A proximity switch comprising:
    a first magnetic field sensitive transducer, a second magnetic field sensitive transducer, and a third magnetic field sensitive transducer;

a first magnet and a second magnet, said first, said second, and said third transducers each capable of being put into a first conductive state when placed near one of said first or said second magnets, and capable of being in a second conductive state when distant from said first or said second magnets; and, means, responsive to said first, said second, and said third magnetic field sensitive transducers, for operating an electric switch between a first state and a second state, said electric switch being in said first state when said first transducer is in said first conductive state, said second transducer is in said first conductive state, and said third transducer is in said second conductive state, and said electric switch being in said second state for any other combination of conductive states of said first, second, and third magnetic field sensitive transducers, whereby said electric switch may be operated into said first state by placing said first magnet sufficiently near said first transducer to put said first transducer in said first conductive state, by placing said second magnet sufficiently near said second transducer to put said second transducer in said first conductive state, and by not placing said first magnet, said second magnet, or any other magnet near said third transducer so that said third transducer is in said second conductive state.

12. The apparatus as in claim 11 wherein said first magnet is capable of putting said first magnetic field sensitive transducer in said first conductive state when a south pole of said first magnet is placed near said first magnetic field sensitive transducer; and, wherein said second magnet is capable of putting said second magnetic field sensitive transducer in said first conductive state when a south pole of said second magnet is placed near said second magnetic field sensitive transducer.

13. The apparatus as in claim 11 wherein said first magnet is capable of putting said first magnetic field sensitive transducer in said first conductive state when a north pole of said first magnet is placed near said first magnet field sensitive transducer; and, wherein said second magnet is capable of putting said second magnetic field sensitive transducer in said first conductive state when a north pole of said second magnet is placed near said second magnetic field sensitive transducer.

14. The apparatus as in claim 11 wherein said first magnetic field sensitive transducer, said second magnetic field sensitive transducer, and said third magnetic field sensitive transducer are mounted in a transducer housing.

15. The apparatus as in claim 11 wherein said first magnet and said second magnet are mounted within a magnet housing.

16. The apparatus as in claim 11 wherein said first magnetic field sensitive transducer, said second magnetic field sensitive transducer, and said third magnetic field sensitive transducer are mounted in a row along a first face of a magnet housing, and said first magnetic field sensitive transducer is on a first side of said housing, said second magnetic field sensitive transducer is on a second side of said housing, and said third magnetic field sensitive transducer is substantially centered between said first magnetic field sensitive transducer and said second magnetic field sensitive transducer.

17. The apparatus as in claim 11 wherein said first magnet is mounted in a magnet housing so that a south pole of said first magnet is adjacent to a first surface of said magnet housing, and, said second magnet is mounted in said magnet housing so that a south pole of said second magnet is adjacent to said first surface of said magnet housing.

18. The apparatus as in claim 11 wherein said first magnet is mounted in a magnet housing so that a north pole of said first magnet is adjacent to a first surface of said magnet housing, and, said second magnet is mounted in said magnet housing so that a north pole of said second magnet is adjacent to said first surface of said magnet housing.

19. A proximity switch comprising:

a first magnetic field sensitive transducer, a second magnetic field sensitive transducer, and a third magnetic field sensitive transducer;

a first magnet and a second magnet, said first, said second, and said third transducers each capable of being put into a first conductive state when placed near one of said first or said second magnets, and capable of being in a second conductive state when distant from said first or said second magnets; and, means, responsive to said first, said second, and said third magnetic field sensitive transducers, for operating an electric switch between a first state and a second state, said electric switch being in said first state when a south pole of said first magnet is near said first transducer so that said first transducer is in said first conductive state, a south pole of said second magnet is near said second transducer so that said second transducer is in said first conductive state, and said third transducer is in said second conductive state, and said electric switch being in said second state for any other combination of conductive states of said first, second, and third magnetic field sensitive transducers, and said electric switch may be operated into said first state by placing a south pole of said first magnet sufficiently near said first transducer to put said first transducer in said first conductive state, by placing a south pole of said second magnet sufficiently near said second transducer to put said second transducer in said first conductive state, and by not placing a magnet near said third transducer so that said third transducer is in said second conductive state.

20. The apparatus as in claim 11 wherein said means for operating an electric switch further comprises:

a logic circuit responsive to the conductive states of said first magnetic field sensitive transducer, said second magnetic field sensitive transducer, and said third magnetic field sensitive transducer and capable of generating an output signal when said first magnetic field sensitive transducer and said second magnetic field sensitive transducer are each in said first conductive state and when said third magnetic field sensitive transducer is in said second conductive state.

21. The apparatus as in claim 1, or 10, or 11 wherein said magnetic field sensitive transducers are Hall effect magnetic field sensors.

* * * * *